US012563712B2

(12) United States Patent
Oeckl

(10) Patent No.: US 12,563,712 B2
(45) Date of Patent: Feb. 24, 2026

(54) SUPPLYING COMPONENTS FROM A CONTINUOUS MATERIAL TO A PLACEMENT MACHINE

(71) Applicant: ASMPT GmbH & Co. KG, Munich (DE)

(72) Inventor: Christoph Oeckl, Munich (DE)

(73) Assignee: ASMPT GmbH & Co. KG (DE)

( * ) Notice: Subject to any disclaimer, the term of this patent is extended or adjusted under 35 U.S.C. 154(b) by 301 days.

(21) Appl. No.: 18/127,752

(22) Filed: Mar. 29, 2023

(65) Prior Publication Data

US 2023/0320053 A1     Oct. 5, 2023

(30) Foreign Application Priority Data

Apr. 1, 2022     (DE) ..................... 10 2022 107 782.9

(51) Int. Cl.
*H05K 13/04*          (2006.01)
(52) U.S. Cl.
CPC ..... *H05K 13/0409* (2018.08); *H05K 13/0413* (2013.01); *H05K 13/0417* (2013.01); *H05K 13/0452* (2013.01)
(58) Field of Classification Search
CPC ........... H05K 13/0409; H05K 13/0413; H05K 13/0417; H05K 13/0452; H05K 13/0408; H05K 13/02; H05K 13/04; H05K 13/041; H05K 13/0419; H05K 13/043
See application file for complete search history.

(56) References Cited

U.S. PATENT DOCUMENTS

| | | | | |
|---|---|---|---|---|
| 5,218,894 A | * | 6/1993 | College | B26D 7/01 83/167 |
| 5,613,864 A | * | 3/1997 | Northey | H05K 13/0409 439/940 |
| 6,230,596 B1 | * | 5/2001 | Reinders | B65H 5/04 271/265.01 |
| 2010/0218654 A1 | * | 9/2010 | Brussel | B29C 43/34 83/78 |
| 2019/0124803 A1 | * | 4/2019 | Lohmeier | H05K 13/0015 |

FOREIGN PATENT DOCUMENTS

| | | | |
|---|---|---|---|
| DE | 102013113389 A1 | 6/2015 | |
| EP | 0188003 A1 | 7/1986 | |
| EP | 0755102 A2 | 1/1997 | |
| JP | S611-156800 A | 7/1986 | |
| JP | H05-062757 A | 3/1993 | |

* cited by examiner

*Primary Examiner* — Lynn E Schwenning
(74) *Attorney, Agent, or Firm* — OSTROLENK FABER LLP

(57)          ABSTRACT

A device (150) for supplying components (197) for a placement machine (100) is described, wherein the components (197) are provided in the form of a continuous material (295). The device (150) has (a) a chassis (252); (b) a transport device (260) attached to the chassis (252) for transporting the continuous material (295) along a transport track towards a pick-up position; and (c) a cutting device (270) which is configured to cut off a section (296) at a leading end of the continuous material (295), wherein the cut-off section (296) represents a supplied component (197). Also described is a placement system (BS) having such a component supplying device (150), and a method for supplying components (197) cut off from a continuous material (295) to a placement machine.

11 Claims, 3 Drawing Sheets

SUPPLYING COMPONENTS FROM A CONTINUOUS MATERIAL TO A PLACEMENT MACHINE

TECHNICAL FIELD

The present invention generally relates to the technical field of placement technology, which is used to place electronic assembly parts on an assembly part carrier. The present invention relates in particular to a device for supplying components cut off from a continuous material to a placement machine. The present invention also relates to a placement system with such a component supplying device and a method for supplying components cut from a continuous material to a placement machine.

BACKGROUND OF THE INVENTION

Electronic assemblies usually comprise an assembly part carrier with a plurality of electronic assembly parts, which are placed on the assembly part carrier and are connected to an electronic circuit by means of suitable electrical conductor tracks. The assembly part carrier, often a printed circuit board, thus represents a mechanical assembly base for the electronic assembly parts on the one hand and an electrical connection structure on the other hand, which has a suitable layout of conductor tracks for contacting the assembly parts.

In order to connect an electronic assembly to other electronic or electrical devices, for example another electronic assembly, in an electronic device, so-called ribbon cables are frequently used in conjunction with pin headers. In addition to the electronic assembly parts of the significant electronic circuit, a pin header is also mounted on the assembly part carrier and connected to the electronic circuit via the electrical connection structure of the electrical conductor tracks.

There are many different types of pin headers. Typical designs are pin headers that have one or two (parallel) rows of (contact) pins. There are also pin headers with various long rows of pins.

For logistical reasons, pin headers are often delivered in the form of continuous material, wound up on a roll. Before placement, suitable long pieces of pin rows must then be cut off for each application in order to obtain a suitable pin header.

For economic reasons, these pin headers, which are cut from a continuous material, are usually mounted on the relevant assembly part carrier by means of manual placement. This manual placement takes place separately from the placement of the electronic assembly parts, which are placed on the significant assembly part carrier by means of an automatic placement process. However, manual placement is comparatively complex and error-prone.

The object of the invention is to simplify the placement of pin headers cut from a continuous material on an assembly part carrier.

SUMMARY OF THE INVENTION

This object is achieved by the subject matter of the independent claims. Advantageous embodiments of the present invention are described in the dependent claims.

According to a first aspect of the invention, a device for supplying components for a placement machine is described, wherein the components are provided in the form of a continuous material. The device described has (a) a chassis; (b) a transport device attached to the chassis for transporting the continuous material along a transport track towards a pick-up position; and (c) a cutting device which is configured to cut off a section at a leading end of the continuous material, wherein the cut section represents a supplied component.

The component supplying device described is based on the knowledge that the handling of the components is simplified by a cutting process which is carried out by means of the cutting device in or on the supplying device. In concrete terms, it is not necessary to provide the components to the component supplying device individually so that they can be conveyed or transported separately to the pick-up position. The components are thus transported to the pick-up position, at least partially, in the form of the continuous material. However, the cutting process takes place in such a timely manner that, at the latest, when the cut-off component is picked up by a placement head of a placement machine, the component has been separated or cut off from the continuous material.

In this document, the term "continuous material" is to be understood as meaning a composite of functional units which are arranged one behind the other along a longitudinal extent and are connected to one another. A functional unit can be the component described or a part thereof, in which case at least two functional units form a component. The continuous material can preferably be wound up into a roll in the form of an elongate strip structure or optionally also folded in some other way, so that it can be stored and/or handled in a spatially compact manner before it is actually used. To create a component, a (front) section of the continuous material is cut off, wherein this section has a predetermined number of functional units, and this number is at least one. It is evident that an elongate belt structure referred to as "continuous material" is of course not continuous in the mathematical sense and of course has two ends, one end being a leading end and the other end being a trailing end with respect to a transport direction. The term "continuous material" merely illustrates that the belt structure, at least in its original state, i.e., before a large number of components have been cut off, is many times longer compared to the length of a component and that the belt structure contains a very large number of components can be made by simply cutting them off. The large number may be at least 50, preferably at least 100, and more preferably at least 200.

According to an exemplary embodiment of the invention, the cutting device is arranged relative to the transport track and the pick-up position in such a way that the component is in the pick-up position immediately after it has been cut off. This has the advantage that the component only has to be transported if the component is still a part or, more precisely, the front section of the continuous material. It is therefore not necessary to transport the (separated) component alone. This has the advantage that the handling of the component and in particular its transport along the transport track is particularly simple and can be implemented in a simple manner using suitable conveying mechanisms.

According to a further exemplary embodiment of the invention, the pick-up position is located in the spatial centre of the separated component in relation to a transport direction defined by the transport track. This has the advantage that the separated component can be picked-up particularly reliably by the placement head or, more precisely, by a component holding device of the placement head. Undesirable tilting due to a non-symmetrical pick-up of the cut-off component can be avoided in this way.

According to a further exemplary embodiment of the invention, the transport device and/or the cutting device is/are configured in such a way that (i) in a first operating state, the cut-off component has a first predetermined length and, (ii) in a second operating state, the cut-off component has a second predetermined length. The second predetermined length differs from the first predetermined length.

By switching between the two operating states, the length of the cut-off component can also be changed dynamically during a placement operation in an advantageous manner. In this way, two components with different lengths can be fed to a placement process using one and the same component supplying device. Advantageously, for such a supply of differently dimensioned components from a continuous material, neither a change of the component supply device nor the use of a second component supply device on the placement machine in question is required. As a result, the number of component supplying devices required can be reduced so that automated processing of components cut off in different lengths becomes economically sensible in the manufacture of electronic assemblies. In this way, manual placement can be avoided, which contributes to a reduction in human error (which is unavoidable in manual placement). Furthermore, in the case of automatic placement using a placement head, the hold-down devices for the components, which are often required for manual placement, are eliminated. This applies in particular when the component comprises a soldering frame, as is the case, for example, with the pin headers mentioned at the outset.

It is pointed out that components of different lengths are geometrically significantly different from one another. It can therefore be advantageous if the pick-up positions of geometrically different components differ. This applies in particular if, for reasons of high process reliability, the components (of different lengths) are gripped in their centre by the placement head, as described above, and the pick-up position is (slightly) shifted as a result.

According to a further exemplary embodiment of the invention, the transport device and/or the cutting device is/are also configured in such a way that, in at least a third operating state, the cut-off component has a third predetermined length. The third predetermined length is different to both the first predetermined length and the second predetermined length.

The described third operating state of the transport device and/or cutting device increases the flexibility of the described component supplying device to the effect that not only two components of different lengths but at least three components of different lengths can be fed to the placement machine. In order to further increase this flexibility, more than three operating states can also be provided, with each of the operating states being assigned its own predetermined length.

In some embodiments, the length of the cut-off components can also be changed continuously.

According to a further exemplary embodiment of the invention, the cutting device is fixedly attached to the chassis and the pick-up position can be changed spatially in relation to the chassis along the transport track, wherein each operating state is assigned its own pick-up position.

The stationary arrangement of the cutting device described has the advantage that all mechanically movable parts of the component supplying device, which are responsible for the cutting process, do not have to be moved in addition (along the direction of the transport track) in order to cut off components of different lengths from the continuous material. In contrast to this, the described spatial variability of the pick-up position can be realised without mechanically moving parts of the component supplying device. Rather, a spatially altered pick-up position can be compensated for by a corresponding positioning of a placement head working according to the so-called "pick and place" or "collect and place" principle. The described stationary arrangement of the cutting device in relation to the chassis thus contributes to the component supplying device described being able to be implemented in a simple manner and with a high level of robustness technically and mechanically.

According to a further exemplary embodiment of the invention, the transport device has a pushing means which is configured to transport the continuous material along the transport track by a predetermined distance.

By suitably controlling the pushing means, a leading end of the continuous material can be transported in a targeted manner so far that in the target position the spatial distance between (i) the cutting device and (ii) the leading end of the continuous material corresponds exactly to the desired length of the component. The different operating states described above can each be defined by a push length, which corresponds to the desired predetermined length of the component.

According to a further exemplary embodiment of the invention, the pushing means has a clamping device. The clamping device is configured to engage the continuous material. Furthermore, the clamping device is displaceable in relation to the chassis along the transport track.

A movement or displacement of the clamping device can be carried out discretely or continuously by a suitable drive, for example a linear motor. The displacement distance can be set so that it corresponds exactly to the length of the cut-off components. Components of different lengths can then be cut off from the continuous material by suitably changing the displacement path.

The clamping device can have two clamping jaws, of which at least one, but preferably both, can be displaced perpendicularly to a transport direction defined by the transport track. As a result, the two clamping jaws can mechanically engage the continuous material and, in a closed state, ensure a reliable positive and/or frictional temporary fixation of the continuous material on the clamping device.

According to a further exemplary embodiment of the invention, the cutting device has two cutting components which are arranged on opposite sides of the transport track. A first cutting component has a cutting blade and the second cutting component has a groove. After a cutting operation, the cutting blade can penetrate at least partially into the groove. This has the advantage that the required cutting process can be implemented in a mechanically simple manner. In addition, the cutting process can be carried out with high precision and great reliability during operation of the described component supplying device.

Depending on the embodiment (with respect to the force of gravity), the two cutting components can be arranged below or above the transport track or alternatively to the left or to the right of the transport track. An arrangement below/above has the advantage that the described component supplying device can be implemented within a very narrow design, so that during operation of the placement machine there is still enough space for assembly part supplying devices next to the described component supplying device and thus in addition to the components cut off from the continuous material, many other types of assembly parts can be supplied to the placement process in a known manner.

According to a further embodiment of the invention, the first cutting component has a guide block for the cutting blade and the second cutting component has a clamping block. The guide block and the clamping block are mutually displaceable such that (i) in an open state, the continuous material can be transported between the guide block and the clamping block and, (ii) in a closed state, the continuous material can be brought into a form-fitting and/or frictional engagement between the guide block and the clamping block. This has the advantage that the continuous material can be fixed in the area of the cutting device before a cutting process using the cutting blade. As a result, particularly precise cuts for cutting off the component can be carried out in an advantageous manner.

According to a further aspect of the invention, a placement system is described for placing electronic assembly parts on an assembly part carrier. The placement system described has (a) a device for supplying components as described above and (b) a placement machine with (b1) a frame structure to which the device for supplying components is (detachably) attached, and (b2) a placement head (i) for receiving at least one supplied component, (ii) for transporting the at least one supplied component and (iii) for placing the at least one transported component on the assembly part carrier.

The placement system described is based on the finding that the final production of the components, which takes place by cutting off a section of continuous material, can be carried out directly on the placement machine. In this way, in an advantageous manner, the components do not have to be brought to the placement machine individually but can be brought to them in the form of continuous material. The components can then still be inserted or applied "on site" in the form of continuous material in or on the device described above. This means that the (logistical) handling of the components is simplified until shortly before they are assembled on the assembly part carrier.

According to an exemplary embodiment of the invention, the placement system also has at least one assembly part supplying device for supplying electronic assembly parts, wherein the at least one component supplying device is also attached to the frame structure of the placement machine.

The assembly part supplying device can be a conventional, known conveyor for electronic assembly parts, with which the electronic assembly parts are made available to the above-mentioned placement head or to another placement head of the placement machine for collection and subsequent placement of the assembly part carrier. As a result, components, in the form of continuous material as well as electronic assembly parts that have already been separated, can be fed to the placement machine in an advantageous manner, and so-called mixed placement of electronic assembly parts and components made of continuous material can be implemented with one and the same placement machine without changing between different types of supplying devices.

The component supplying device described can be a so-called belt conveyor, with which electronic assembly parts packaged in a component belt are sequentially fed to the placement process in a known manner. Alternatively, the component supplying device can also be a supplying device for electronic assembly parts present as bulk goods, which supplies the separated components for the purpose of being picked-up by the placement head in a pick-up area. Furthermore, the component supplying device can also be a so-called wafer supplying device so that the placement head can pick-up unhoused chips directly from a wafer. In addition to the component supplying device described, several different types of component supplying devices can also be attached to the placement machine.

According to a further aspect of the invention, a method for supplying components for a placement machine is described, wherein the components are provided in the form of a continuous material. The method described is carried out using a device described above for supplying components which are provided in the form of a continuous material. The method described has the following steps: (a) transporting the continuous material along the transport track to the pick-up position; and (b) cutting off the section of the continuous material, wherein the cut-off section represents the supplied component.

The method described is also based on the knowledge that the components are only produced in the component supplying device described by a simple cutting process from the transported continuous material. As a result, a large number of components can be handled in a (logistically) simple manner in the form of continuous material until immediately before the cutting process or until shortly before the respective component is picked-up by a placement head.

According to one embodiment of the invention, the component is a pin header. This has the advantage of efficiently supplying a type of component that is particularly difficult to handle in singular form. This difficult handling results, for example, from the fact that pin headers typically cannot (individually) be packed in component belts due to their shape and size. Supplying pin headers as bulk goods is also usually ruled out due to their shape, as their pins can easily get caught in one another. By supplying the pin headers in the form of continuous material, the problem of handling the pin headers is simplified, and a hitherto customary manual placement of pin headers can be advantageously replaced by automatic placement.

In this document, the term "pin header" is to be understood in particular as meaning a connector with multiple pin contacts arranged in a row, which is used on assembly part carriers or on printed circuit boards for electronic assemblies. The purpose of the pin header is in particular to establish a connection with many contacts from an assembly built on a assembly part carrier to another (peripheral) assembly, usually with the help of ribbon cables and pin headers or a so-called socket strip.

According to a further exemplary embodiment of the invention, the section is held by a placement head during the cutting operation. This has the advantage that the cutting process can be carried out with a particular level of precision because unwanted movement of the section during the cutting process is prevented or at least significantly reduced. Furthermore, the component is already gripped by the placement head during its production (or after the section has been cut off), so that "losing the component" can be reliably avoided. As a result, a particularly high level of process reliability can be achieved during the supplying and further handling of the cut-off component by the placement head.

It should be noted that the placement head may use any suitable component holding device, typically different from an assembly part holding device, to grip the cut section or component. In this context, a component holding device can in particular be what is known as a suction gripper, which holds a component on its end face by means of negative pressure. For example, a component holding device may have two jaws that grip the component on opposite lateral surfaces. In some embodiments, at least one clamping jaw can be actuated pneumatically.

It should be noted that embodiments of the invention have been described with reference to different objects of the invention. In particular, some embodiments of the invention are described with device claims and other embodiments of the invention with procedural claims. However, when reading this document, it is immediately clear to the person skilled in the art that, if not otherwise explicitly stated, in addition to a combination of features belonging to one type of object of the invention, any combination of features belonging to different types of objects of the invention is possible.

Further advantages and features of the present invention arise from the following exemplary description of currently preferable embodiments.

DETAILED DESCRIPTION

It is noted that the following described embodiments only represent a limited selection of possible variations of embodiments of the invention. In particular, it is possible to combine the features of individual embodiments in a suitable manner, such that a multitude of different embodiments can be viewed as obviously disclosed for the person skilled in the art with the embodiments explicitly described here.

Figure 1:
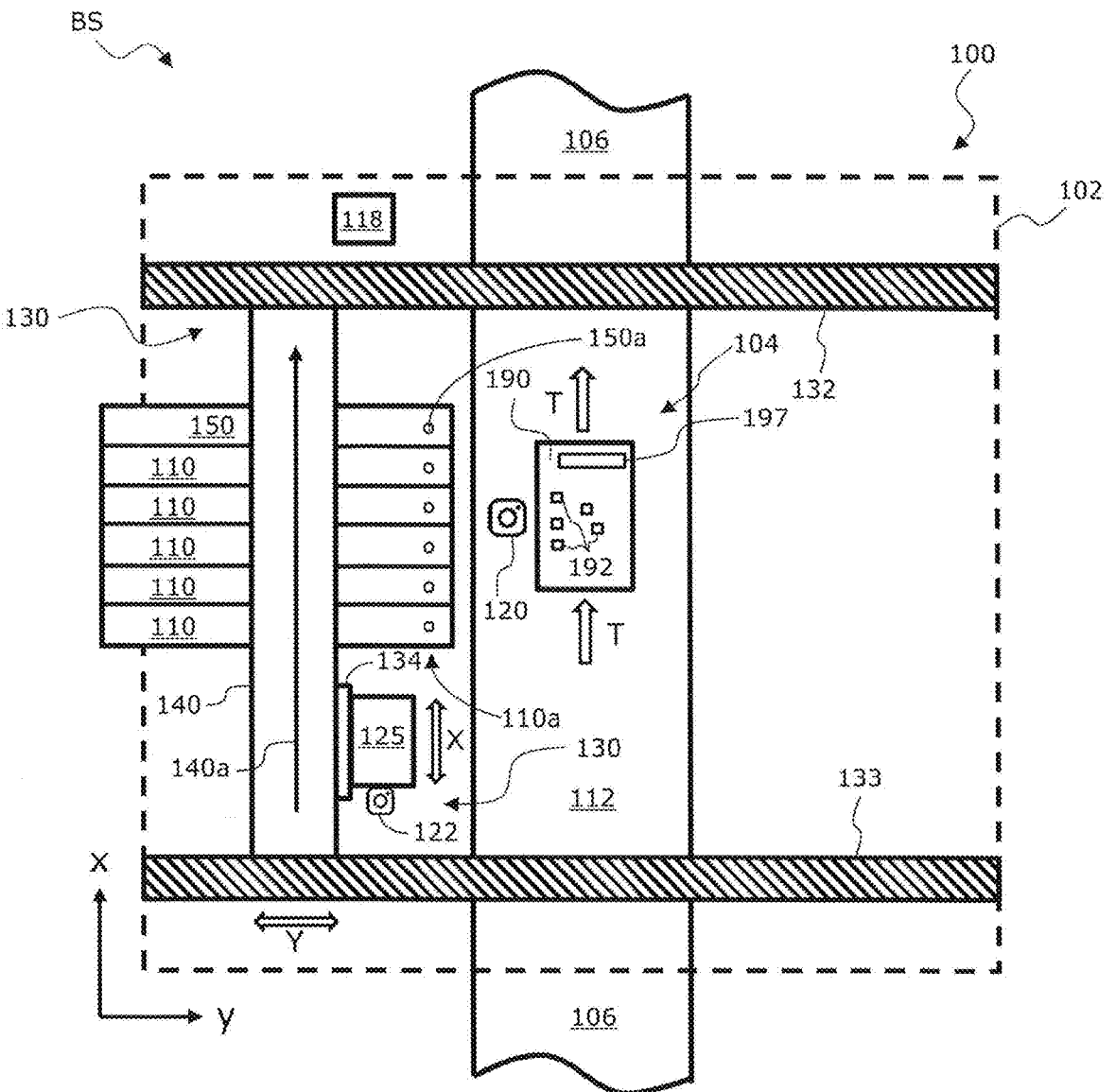
FIG. 1 shows a placement system according to an exemplary embodiment of the invention.

FIG. 1 shows a schematic representation of a placement system BS for the placement of assembly part carriers or printed circuit boards 190 with electronic assembly parts 192 and with components 197, which have been cut off from a continuous material immediately before they were placed. According to the exemplary embodiment shown here, the components are so-called pin headers 197, which have a plurality of pins or contact pins integrated in a plastic body. With such a pin header, an electronic assembly installed on the assembly part carrier 190 in question can be electrically conductively connected to another external electronic assembly or to another peripheral device via a ribbon cable.

The placement system BS has a placement machine 100 and a supplying system.

According to the exemplary embodiment illustrated here, the supplying system comprises multiple assembly part supplying devices 110 and a component supplying device 150. According to the exemplary embodiment illustrated here, the assembly part supplying devices 110 are so-called belt conveyors, with which electronic assembly parts 192 packaged in an assembly part belt are sequentially fed to the placement process. Specifically, an electronic assembly part 192 is provided with each belt conveyor 110 in a known manner at an assembly part pick-up position 110a, where it is then picked-up by a placement head 125 and placed on the assembly part carrier 190. After being picked-up by the placement head 125, a subsequent assembly part 192 is made available at the assembly part pick-up position 110a, which can then also be picked-up by the placement head 125.

In a corresponding manner, a component or pin header 197 is made available at a component pick-up position 150a by means of the component supplying device 150. From there, it can also be picked-up by the placement head 125 or by another placement head, not shown in FIG. 1, with a suitable component holding device, for example a gripper, and placed on the assembly part carrier 190.

The placement machine 100 has a frame structure 102. Two stationary carrier rails 132 and 133 are attached to the frame structure 102 and each extend along a y-direction. The two carrier rails 132, 133 are part of a positioning system 130 for the placement head 125.

A movable support arm 140 is attached to the two stationary carrier rails 132 and 133 and extends along a longitudinal axis 140a, which runs parallel to the x-direction in the coordinate system used here. The movable support arm 140 can be moved along the y-direction, driven by drive motors (not shown) in the form of linear motors. The corresponding direction of travel is marked with a double arrow "Y".

An assembly component 134 is attached to the support arm 140, which can be, for example, a carriage that is held on a linear guide (not shown) and can be moved along the x-direction by means of a further linear motor (also not shown). The corresponding direction of travel is marked with a double arrow "X". The placement head 125 is attached to the assembly component 134 in a known manner.

The two stationary carrier rails 132, 133, the movable support arm 140 and the assembly component 134, together with the linear motors and linear guides (also not shown in FIG. 1) represent the positioning system 130, with which the placement head 125 can be moved or positioned within the xy plane.

The assembly part carriers 190 are placed in a placement area 104. Before placement, the assembly part carrier 190 to be assembled is transported into the placement area 104 by means of a transport device 106, for example a conveyor belt. After at least partial placement with assembly parts 192 and/or components or pin headers 197, the assembly part carrier 190 is transported away by means of the transport device 106. The corresponding transport directions are each marked with an arrow T in FIG. 1.

As already mentioned above, the placement head 125 is attached to the assembly component 134. The placement head 125 can be moved between the pick-up positions 110a or 150a and the placement area 110 by suitably controlling the linear motors (not shown). A data processing device 118, which controls the placement process, is communicatively coupled to the various linear motors and the placement head 125 via data lines (not shown). During a placement process, the placement head 125 is moved to the respective pick-up position 110a or 150a, where at least one assembly part 192 and/or one component 197 is/are picked-up. The placement head 125 is then moved into the placement area 110, where the assembly parts 192 or the components 197 are placed on the assembly part carrier 190 provided. After that, the "empty" placement head 125 is moved back to the supplying system, where assembly parts 192 and/or a component 197 are picked-up again.

It is pointed out that the supplying system can also have more than one component supplying device 150. If necessary, two (or more) components or pin headers can then be picked-up at the same time with a so-called multiple placement head and transported together into the placement area 104.

As can be seen from FIG. 1, the placement machine 100 further has two cameras. A first stationary camera 120 is used to measure the assembly parts 192 or components 197 picked-up by the placement head 125. For this purpose, the placement head 125 is positioned above the camera 120 so that the assembly parts 192/components 197 picked-up reach the detection range of the camera 120. During this measurement, for example, the exact angular position of an engaged or held assembly part 192 or an engaged or held component 197 can be measured. When the significant assembly part 192 or the relevant component 197 is placed, a deviation in the angular position can then be compensated for in a suitable manner by a suitable rotation of a holding device of the placement head 125, so that the relevant assembly part 192 or the relevant component 197 is placed on the assembly part carrier 190 in a correct angular position.

A second camera 122 is used for the precise measurement of markings that are attached to the top of the assembly part carrier 190 to be placed. As a result, the exact spatial position of the assembly part carrier 190 within the placement area 104 can be recognized and taken into account when positioning the placement head 125 such that the assembly parts 192 or the components 197 are actually placed exactly at a specific target position on the assembly part carrier 190. According to the exemplary embodiment illustrated here, the second camera 122 is attached to the placement head 125 and is moved together with the placement head 125 to measure the markings on the assembly part carrier 190.

FIGS. 2a to 2h illustrate a sequence for cutting a pin header of a predetermined length from a continuous material 295, the cutting being carried out in a component supplying device which is also identified by the reference sign 150 in these figures.

The component supplying device 150 has a chassis 252 and a transport device 260 which is attached to the chassis 252. In addition, the component supplying device 150 has a cutting device 270.

Figure 2:
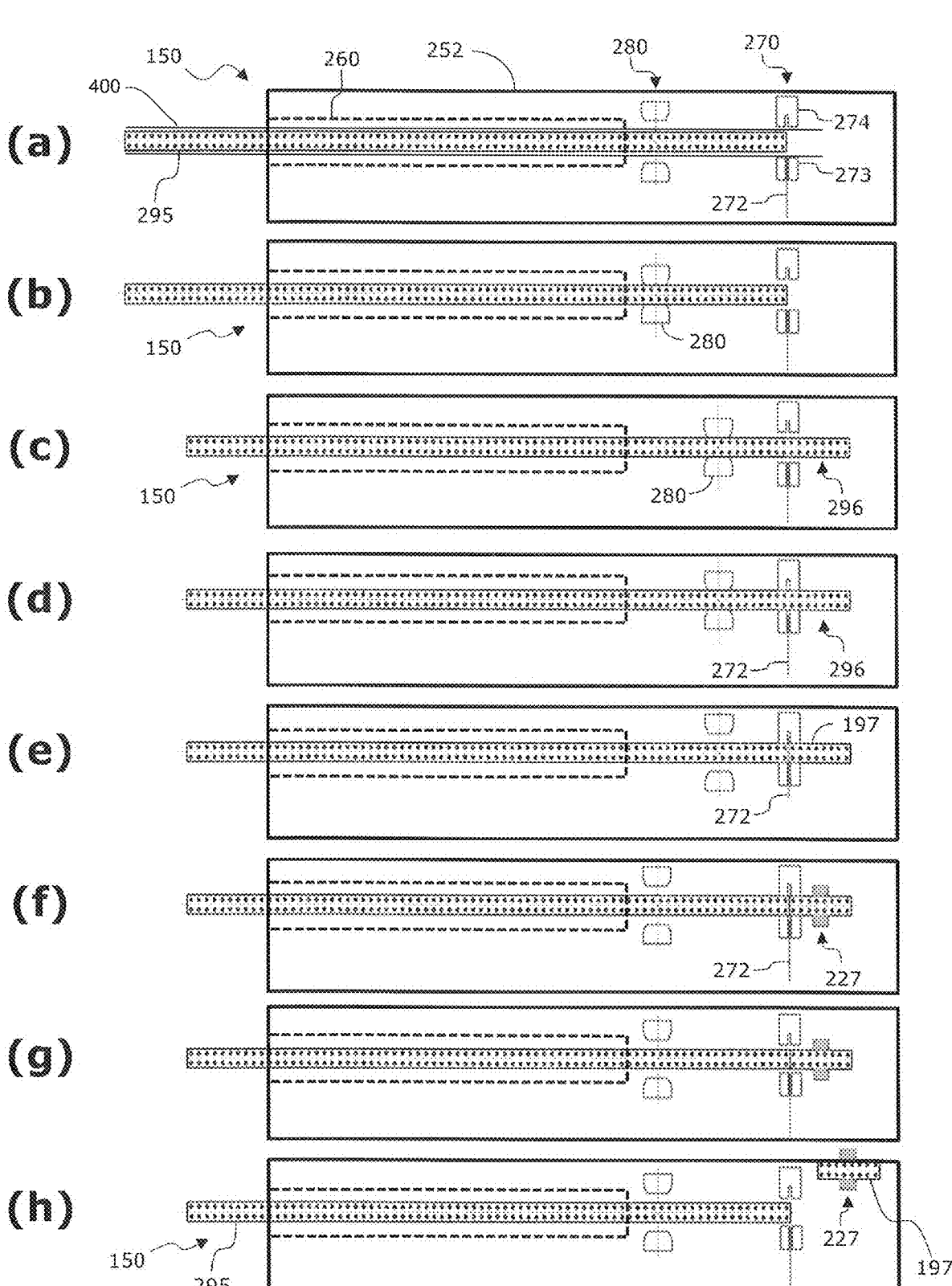
FIGS. 2a to 2h illustrate a method for cutting off a pin header with a predetermined length.

According to the exemplary embodiment illustrated here, the cutting device 270 comprises two cutting components, a first cutting component and a second cutting component 274. In the embodiment shown here, the first cutting component has a cutting blade 272 which is guided in a guide block 273. The cutting blade 272 can be moved by an actuator (not shown) in the direction of the second cutting component 274 in order to cut off a component or pin header 197 from the continuous material 295. According to the exemplary embodiment illustrated here, the second cutting component is a clamping block 274 with a groove, into which the cutting blade 272 can at least partially penetrate after a cutting process. The cutting device 270 is thus configured to cut off a section 296 at a leading end of the continuous material 295, wherein the cut-off section 296 then represents the pin header 197, which can be supplied by the component supply device 150 to a placement process. In this case, the pin header 197 is picked-up by the placement head at a pick-up position immediately (on the right) next to the cutting device 270. The placement head is not shown here in its entirety. Only FIGS. 2f, 2g and 2h show a component holding device 227 of this placement head designed as a gripper with two gripper jaws.

According to the exemplary embodiment illustrated here, the component supplying device 150 also has a pushing means 280, which in turn has a clamping device. Controlled by an actuator (not shown), this can engage the continuous material 295 laterally by means of two clamping jaws. Only the clamping device of the pushing means 280 is shown in the figures. The clamping device is therefore also marked with the reference number 280.

By displacing the clamping device 280, provided that the continuous material 295 is engaged, the continuous material 295 is displaced in the direction of the cutting device 270 and a predetermined distance beyond it. The clamping device 280 is also displaced automatically by means of a drive, which is not shown. The predetermined distance determines the length of the cut-off pin header 197.

It is pointed out that in other embodiments, the transport device 260 can also assume the function of the pushing means 280. However, this presupposes that the transport device 260 can also move the belt structure 295 in a precise manner by a precisely defined distance (beyond the cutting device 270), so that the pin headers 197 that have been cut off have exactly their respective predetermined length.

FIG. 2a shows an initial state of the component supplying device 150. An elongate belt structure 295 designed as continuous material was moved by the transport device along a transport track 400 (not shown in detail) (to the right in FIG. 2a) such that a leading end of the belt structure 295 is located exactly on a cutting edge of the cutting device 270. Since, according to the exemplary embodiment shown here, the elongate belt structure 295 is transported exclusively by the transport device 260, the clamping device 280 of the pushing means 280 is (still) in an open state.

FIG. 2b shows a state in which the clamping device 280 has engaged the belt structure 295.

FIG. 2c shows a state in which the clamping device 280 has been moved to the right, wherein the travel path corresponds exactly to the aforementioned predetermined distance. This distance will later determine the length of the pin header 197 that has been cut off. During movement of the clamping device 280, the cutting device 270 is in an open state. This means that the guide block 273 and the clamping block 274 are spaced far enough from one another that the continuous material or the elongate belt structure 295 can be transported between the two blocks.

FIG. 2d shows a state in which the cutting device 270 is in a closed state. This means that the guide block 273 and the clamping block 274 engage the elongate belt structure 295. This enables an extremely robust fixation of the elongate belt structure 295.

FIG. 2e illustrates the separating of the leading section of the elongate belt structure 295. The cutting blade 272 has separated the belt structure 295 and the blade of the cutting blade 272 is within the groove of the clamping block 274. In addition, preferably after the actual cutting process, the clamping device 280 is moved back into its open position.

FIG. 2f shows a state in which the cutting blade 272 has been moved back into its starting position. In addition, the placement head, which is not shown, is in a position in which the pin header 197 that has been cut off can be picked-up. In FIG. 2f, the two gripping jaws 227 of the component holding device of the placement head can be seen, which have engaged the cut-off pin header 197.

FIG. 2g shows a state in which the cutting device 270 is again in its open position. This releases both the "new" leading end of the belt structure 295 and the cut-off pin header 197.

FIG. 2h illustrates the picking-up of the cut pin header 197. The state of the component supplying device 150 and the (remaining) part of the continuous material 295 is identical to the states shown in FIG. 2a. By repeating the sequence of steps shown in FIGS. 2b to 2h, a further pin header can be made available to the placement head for picking-up.

It is pointed out that the further pin header that is still to be separated can have the same length as the pin header that has already been separated. In the method described here, the length of the respective pin header depends only on the distance with which the clamping device 280 (in the closed state) is moved to the right (cf. FIGS. 2*b* and 2*c*).

Figure 3:
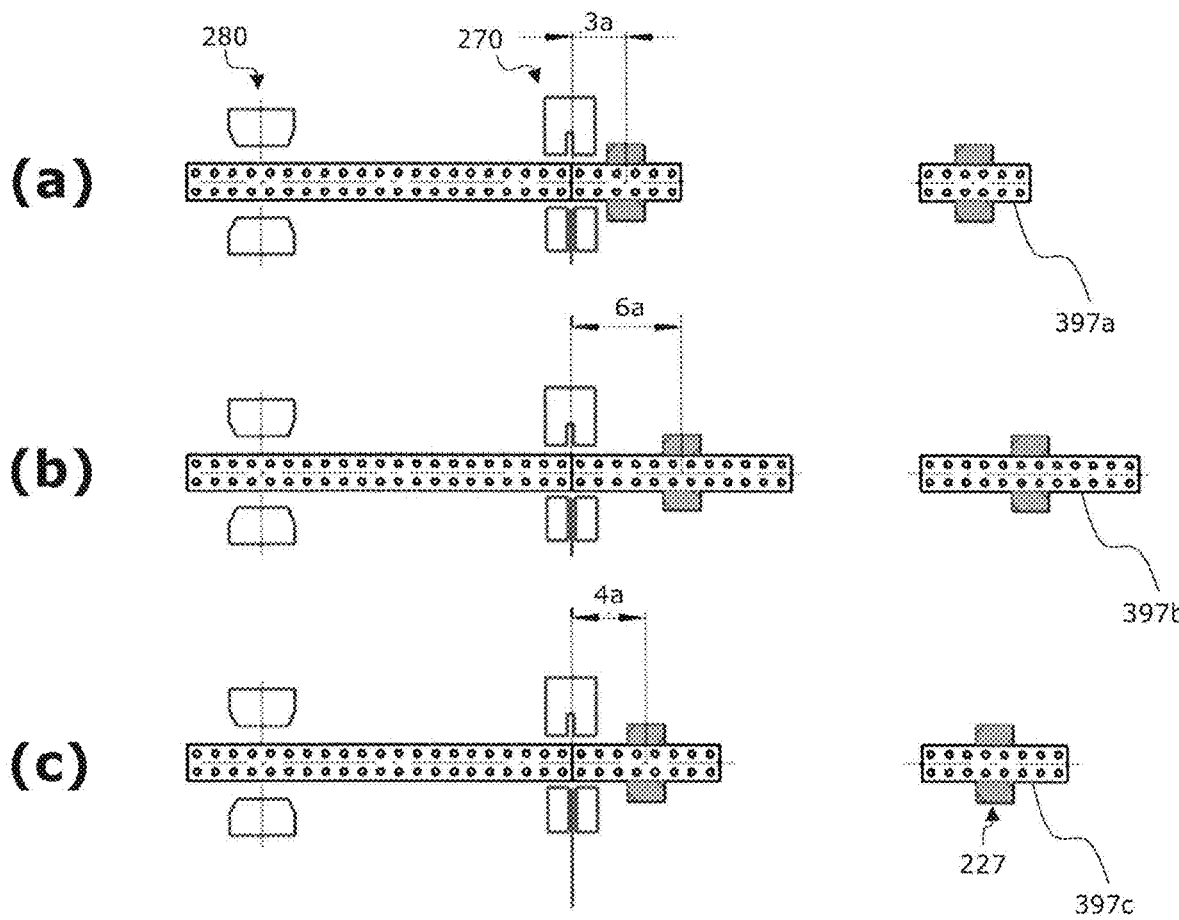
FIGS. 3a to 3c illustrate the cutting-off of three pin headers of different lengths.

FIGS. 3*a* to 3*c* illustrate the cutting-off of three pin headers of different lengths. As is also shown in FIGS. 2*a* to 2*h*, all pin headers have two rows of pins. However, it is pointed out that pin headers with only one row or more than two rows can also be provided with the described component supplying device 150 with a predefined length.

FIG. 3*a* illustrates operation of the component supplying device in which 2×6 pin headers 397*a* are cut off. This means that the pin headers 397*a* have a total of 12 pins in 2 rows. FIG. 3*b* illustrates an operation of the component supplying device in which 2×12 pin headers 397*b* are cut off. FIG. 3*c* illustrates an operation of the component supplying device in which 2×8 pin headers 397*c* are cut off.

In all of the variants shown in FIGS. 3*a* to 3*c*, the cut-off components 397*a*, 397*b*, 397*c* are picked-up in such a way that they are gripped in the centre by the gripper 227 of the placement head (again, not shown). The corresponding central pick-up position is then, depending on the length of the components 397*a*, 397*b*, 397*c*, more or less far to the right of the cutting device 270. In FIGS. 3*a* to 3*c*, the distance between the cutting device 270 and the central pick-up position is given in units of the pitch distance a between two adjacent pins within a row. It is obvious that the distance between the cutting device 270 and the central pick-up position corresponds to the pitch distance a multiplied by half the number of pins in a row.

It is noted that the term "have" does not exclude other elements and that the word "one or a" does not exclude a plurality. Elements, which are described in connection with different exemplified embodiments, can also be combined. It should also be noted that reference numerals in the claims should not be construed as limiting the scope of the claims.

REFERENCE SIGNS

100 Placement machine
102 Frame structure
104 Placement area
106 Transport device
110 Assembly part supplying devices/Belt conveyor
110*a* Assembly part pick-up positions
118 Data processing device/Control device
120 Stationary camera/Assembly part camera
122 Movable camera/Circuit board camera
125 Placement head
130 Positioning system
132 Stationary carrier rail
133 Further stationary carrier rail
134 Assembly component
140 Movable support arm
140*a* Longitudinal axis
150 Component supplying device
150*a* Component pick-up position
190 Assembly part carrier/Circuit board
192 Electronic assembly part
197 Component/Pin header
BS Placement system
T Transport direction
227 Component holding device/Gripper/Gripper jaws
252 Chassis
260 Transport device
270 Cutting device
272 Cutting blade
273 Guide block

274 Second cutting component/Clamping block (with groove)
280 Pushing means/Clamping device
295 Continuous material/Elongate belt structure
296 Section
397*a* Pin header 2×6
397*b* Pin header 2×12
397*c* Pin header 2×8
400 Transport track

The invention claimed is:

1. A device for supplying components for a placement machine, wherein the components are provided in the form of a continuous material, the device comprising:
   a chassis;
   a transport device attached to the chassis for transporting the continuous material along a horizontally-extending transport track towards a pick-up position; and
   a cutting device which is configured to cut off a section at a leading end of the continuous material, wherein the cut-off section represents a supplied component,
   wherein the transport device and/or the cutting device is configured in such a way that
   in a first operating state, the cut-off component has a first predetermined length, and
   in a second operating state, the cut-off component has a second predetermined length, wherein the second predetermined length is different to the first predetermined length,
   the cutting device is attached to the chassis in a stationary manner and the pick-up position can be changed spatially along the transport track in relation to the chassis, wherein each operating state is assigned its own pick-up position,
   the transport device has a pushing means configured to transport the continuous material a predetermined distance horizontally along the transport track, and
   the pushing means has a clamping device configured to engage the continuous material and which is displaceable relative to the chassis horizontally along the transport track.

2. The device according to claim 1, wherein the cutting device is arranged relative to the transport track and the pick-up position in such a way that the component is located in the pick-up position immediately after cutting.

3. The device according to claim 1, wherein the pick-up position is in the spatial centre of the separated component in relation to a transport direction defined by the transport track.

4. The device according to claim 1, wherein the transport device and/or the cutting device is further configured in such a way that in at least a third operating state, the cut-off component has a third predetermined length, wherein the third predetermined length is different to both the first predetermined length and the second predetermined length.

5. The device according to claim 1, wherein the cutting device has two cutting components which are arranged on opposite sides of the transport track, wherein a first cutting component has a cutting blade and the second cutting component has a groove into which the cutting blade can penetrate at least partially after a separation process.

6. The device according to claim 5, wherein the first cutting component has a guide block for the cutting blade and the second cutting component has a clamping block, wherein the guide block and the clamping block are displaceable relative to one another such that, (i) in an open state, the continuous material can be transported between the guide block and the clamping block and, (ii) in a closed state, the continuous material can be brought into a form-fitting and/or frictional engagement between the guide block and the clamping block.

7. A placement system (BS) for placing electronic assembly parts on an assembly part carrier, the placement system (BS) comprising:

a device for supplying components according to claim 1 and a placement machine with a frame structure, to which the device for supplying components is attached, and a placement head for (i) receiving at least one supplied component, (ii) transporting the at least one received component and (iii) placing the at least one transported component on the assembly part carrier.

8. The placement system (BS) according to claim 7, further comprising at least one assembly part supplying device for supplying electronic assembly parts, wherein the at least one assembly part supplying device is also attached to the frame structure of the placement machine.

9. A method for supplying components for a placement machine, wherein the components are provided in the form of a continuous material, using a device according to claim 1, the method comprising transporting the continuous material horizontally along the transport track towards the pick-up position; and cutting off the section of the continuous material, wherein the cut-off section represents the supplied component.

10. The method according to claim 9, wherein the component is a pin header.

11. The method according to claim 9, wherein the section is held by a placement head during cutting.

* * * * *